(12) United States Patent
Yamamoto

(10) Patent No.: US 8,693,815 B2
(45) Date of Patent: Apr. 8, 2014

(54) OPTOELECTRONIC COMPOSITE SUBSTRATE AND METHOD OF MANUFACTURING THE SAME

(75) Inventor: Kazunao Yamamoto, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 328 days.

(21) Appl. No.: 13/079,951

(22) Filed: Apr. 5, 2011

(65) Prior Publication Data

US 2011/0274388 A1    Nov. 10, 2011

(30) Foreign Application Priority Data

May 7, 2010 (JP) ................................. 2010-106956

(51) Int. Cl.
*G02B 6/00* (2006.01)

(52) U.S. Cl.
USPC .......................................................... 385/14

(58) Field of Classification Search
None
See application file for complete search history.

(56) References Cited

U.S. PATENT DOCUMENTS

| | | | |
|---|---|---|---|
| 6,739,761 B2 * | 5/2004 | Tsukamoto et al. | ............ 385/89 |
| 6,913,705 B2 * | 7/2005 | Nakata | ............................ 216/24 |
| 7,680,367 B2 | 3/2010 | Matsuoka et al. | |
| 2008/0279518 A1 | 11/2008 | Yonekura et al. | |

FOREIGN PATENT DOCUMENTS

| | | |
|---|---|---|
| JP | 2002-277694 A | 9/2002 |
| JP | 2008-281816 A1 | 11/2008 |
| JP | 2010-39082 A1 | 2/2010 |
| WO | 2006/054569 A1 | 5/2006 |

OTHER PUBLICATIONS

Notice of Reason for Refusal from the Japanese Patent Office mailed Jul. 30, 2013, in the corresponding Japanese patent application No. Takugan 2010-106956.

* cited by examiner

*Primary Examiner* — Jerry Rahll
(74) *Attorney, Agent, or Firm* — Kratz, Quintos & Hanson, LLP

(57) ABSTRACT

A method of manufacturing an optoelectronic composite substrate, includes forming a first cladding layer in an area except the connection pad on a wiring substrate including a connection pad on an upper surface, forming a belt-like core layer on the first cladding layer, and obtaining an optical waveguide having a structure in which the core layer is surrounded by the first cladding layer and the second cladding layer, by forming a second cladding layer which covers the core layer. A thickness of the first cladding layer is set identically to a thickness of the connection pad, and thus a level difference caused by the connection pad is eliminated.

8 Claims, 6 Drawing Sheets

(fragmental sectional view)

(fragmental plan view)

(fragmental plan view)

(fragmental plan view)

US 8,693,815 B2

OPTOELECTRONIC COMPOSITE SUBSTRATE AND METHOD OF MANUFACTURING THE SAME

CROSS-REFERENCE TO RELATED APPLICATIONS

This application is based upon and claims the benefit of priority of the prior Japanese Patent Application No. 2010-106956, filed on May 7, 2010; the entire contents of which are incorporated herein by reference.

FIELD

It is related to an optoelectronic composite substrate and a method of manufacturing the same.

BACKGROUND

Recently, the development of the backbone network communication line as mainly focusing on the optical fiber communication technology is proceeding steadily, in such a situation, the electronic wirings in the information terminal are becoming a bottleneck. Against such background, instead of the conventional electric circuit substrate in which all signal transmissions are made by using the electric signal, the optoelectronic composite substrate (optical waveguide device) of the type that transmits high-speed parts by the light has been proposed, in order to compensate the limit of transmission speed of the electric signal.

In the case that the light emitting element and the light receiving element of the surface mounted type are mounted to the optical waveguide, the light path conversion inclined surface that is inclined to intersect with the light propagation direction at an angle of 45° is formed at both ends of the optical waveguide, and then the light path conversion mirror is constructed to contact with the light path conversion inclined surface, so that the light path conversion is made.

In Patent Literature 1 (Japanese Laid-Open Patent Publication No. 2008-281816), it is set forth that the optical waveguide main body has the first area that a light signal is transmitted and the second area that is provided on both sides of the first area and does not contribute to a transmission of the light signal, and the penetration vias are provided in the second areas in the optical waveguide main body and also the first area of the optical waveguide main body is formed to protrude upward from both second areas of the optical waveguide main body.

Also, in Patent Literature 2 (Japanese Laid-Open Patent Publication No. 2010-39082), it is set forth that the optical circuit substrate is constructed by forming the printed wiring substrate, the optical waveguide, the light path converting portion, and the second cladding layer covering this light path converting portion on the supporting substrate, and then by peeling the supporting substrate.

As explained in the column of the related art described later, in forming the optical waveguide on the wiring substrate, the core layer is obtained by patterning the photosensitive resin layer based on the contact exposure system.

However, because of the influence of the connection pads of the wiring substrate, a level difference is caused in the photosensitive resin layer that is used to obtain the core layer. Therefore, it becomes difficult to contact the whole of the photomask to the photosensitive resin layer.

Accordingly, primary performance of the contact exposure cannot be fully drawn out. As a result, a pattern width of the core layer is varied beyond the design specification, and furthermore in some cases the resolution failure may occur, so that such a problem arises that the optical waveguide cannot be formed with good yield.

SUMMARY

According to one aspect discussed herein, there is provided a method of manufacturing an optoelectronic composite substrate, which includes, forming a first cladding layer in an area except a connection pad on a wiring substrate including the connection pad on an upper surface, forming a belt-like core layer on the first cladding layer, and obtaining an optical waveguide having a structure in which the core layer is surrounded by the first cladding layer and the second cladding layer, by forming a second cladding layer which covers the core layer.

According to another aspect discussed herein, there is provided an optoelectronic composite substrate, which includes, a wiring substrate including a connection pad on an upper surface, and an optical waveguide including a first cladding layer formed in an area except the connection pad on the wiring substrate, a belt-like core layer formed on the first cladding layer, and a second cladding layer covering the core layer.

DESCRIPTION OF EMBODIMENT

An embodiment of the present invention will be explained with reference to the accompanying drawings hereinafter.

(Related Art)

Figure 1A:
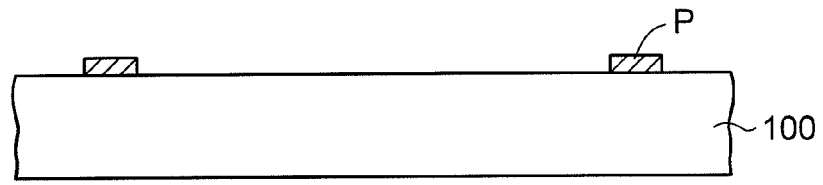
FIGS. 1A to 1C are sectional views explaining a problem of a method of manufacturing an optoelectronic composite substrate in the prior art.
Figure 1B:
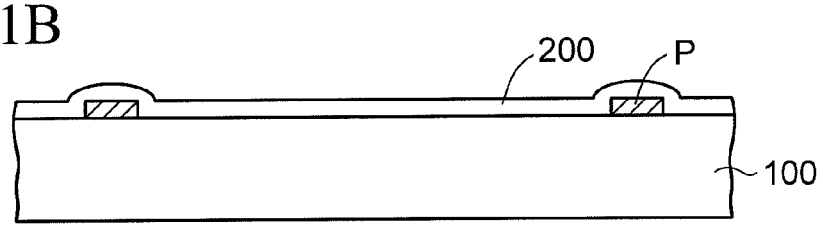
Figure 1C:
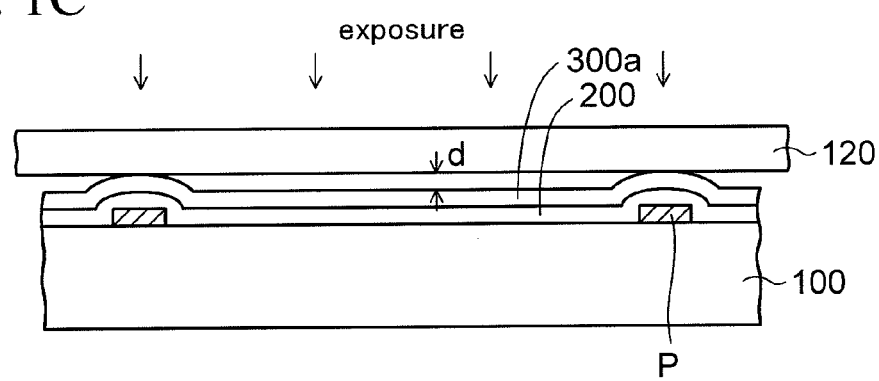
Figure 1C:
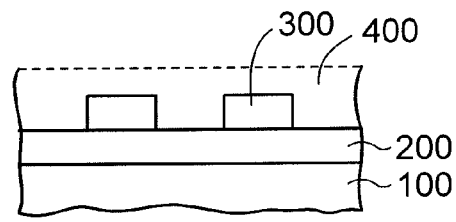

Prior to the explanation of an embodiment, a problem of the related art (preliminary matter) will be explained hereunder. FIGS. 1A to 1C are sectional views explaining a problem of a method of manufacturing an optoelectronic composite substrate in the prior art.

In the method of manufacturing an optoelectronic composite substrate in the prior art, as depicted in FIG. 1A, first, a wiring substrate 100 which includes connection pads P on an upper surface is prepared. A required multilayer wiring (not shown) which is connected to the connection pads P is built in the wiring substrate 100. A thickness of the connection pad P is 10 to 20 μm, and thus a level difference of 10 to 20 μm arises on the upper surface of the wiring substrate 100.

Then, as depicted in FIG. 1B, a first cladding layer 200 is formed on the whole upper surface of the wiring substrate 100. Since a level difference arises on the upper surface of the wiring substrate 100 by the connection pad P, such a situation is obtained that the first cladding layer 200 rises on the connection pads P, and the first cladding layer 200 is formed in a state that a level difference is caused.

Then, as depicted in FIG. 1C, a photosensitive resin layer 300a for obtaining a core layer is formed on the first cladding layer 200. The photosensitive resin layer 300a is also formed in a state that a level difference is caused on the connection pads P.

Then, the photosensitive resin layer 300a is patterned by the photolithography. At this time, as depicted in FIG. 1C, the contact exposure system in which the exposure is performed while contacting photomask 120 to the photosensitive resin layer 300a is employed. Because the contact exposure is employed, a sufficient patterning precision can be attained.

However, the upper surface of the photosensitive resin layer 300a rises on the connection pads P to cause a level difference. Therefore, a clearance d is produced between the photomask 120 and the photosensitive resin layer 300a, so that it is difficult to contact the whole of the photomask 120 to the photosensitive resin layer 300a. In such state, primary performance of the contact exposure cannot be fully drawn out.

Accordingly, when a core layer 300 (in a fragmental sectional view of FIG. 1C) is formed by applying the exposure/development to the photosensitive resin layer 300a, variation in a pattern width of a core layer 300 is considerably increased rather than the case where the normal contact exposure can be performed. As a result, a pattern width of the core layer 300 deviates from the design specification.

In addition, in the case that the connection pads P does not exist to one end side of the photomask 120, the photomask 120 is arranged in a inclined state by the level difference of the connection pad P, and thus a patterning precision of the core layers 300 becomes worse. Furthermore the resolution failure is occurred, and in some cases the patterns are formed in a mutually connected state.

As depicted in a fragmental sectional view of FIG. 1C, the core layers 300 which are patterned like a belt shape are formed, and then a second cladding layer 400 is formed on the core layers 300, thus the optical waveguide is constructed. However, when the core layers 300 are formed, the pattern width of the core layers 300 deviates from the design specification. As a result, it is difficult to form the optical waveguide that has desired characteristics.

An embodiment of the present invention explained in the following can overcome the failures mentioned above.

Embodiment

Figure 3A:
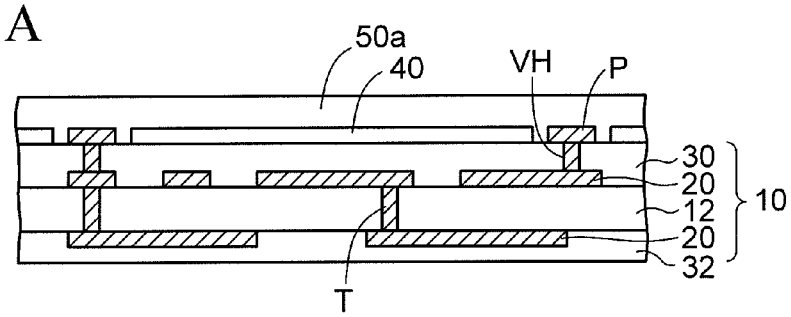
FIGS. 3A and 3C are sectional views and a plan view (#2) depicting the method of manufacturing the optoelectronic composite substrate according to the embodiment.
Figure 3B:
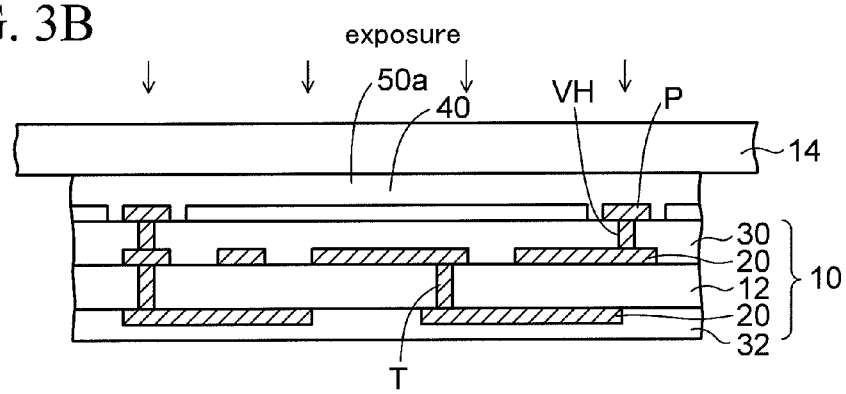
Figure 3C:
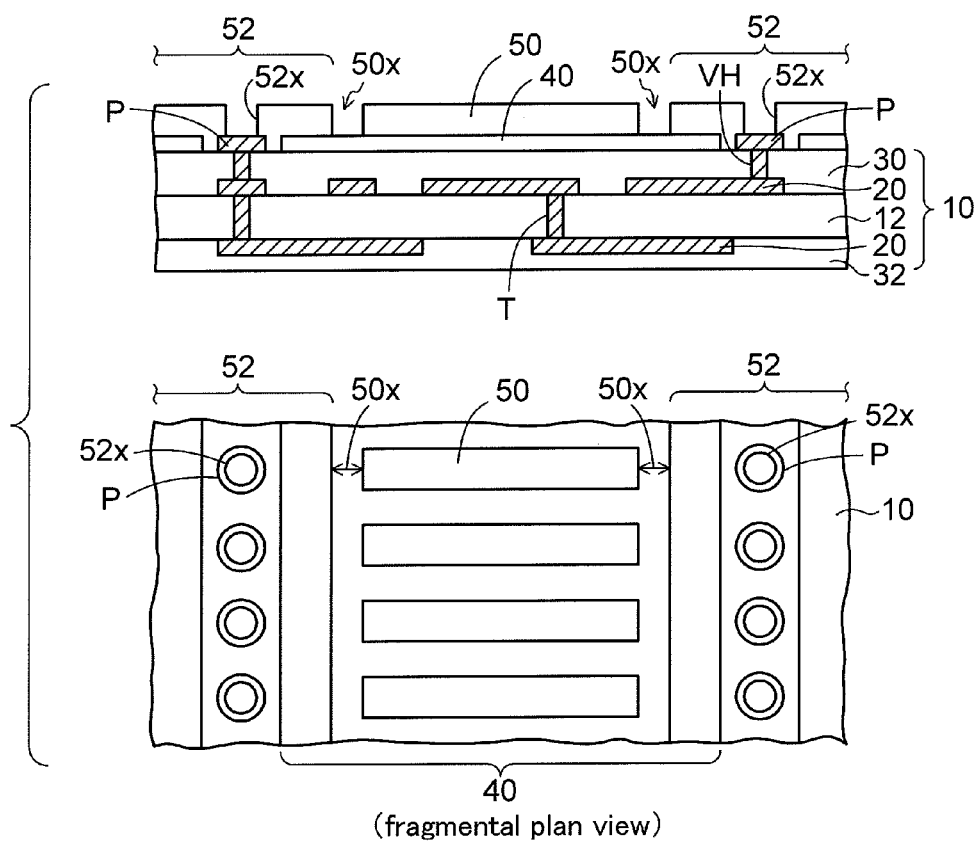
Figure 4A:
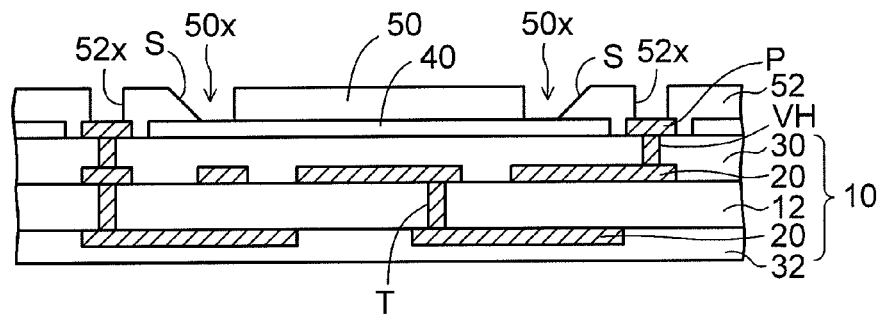
FIGS. 4A to 4D are sectional views (#3) depicting the method of manufacturing the optoelectronic composite substrate according to the embodiment.
Figure 4B:
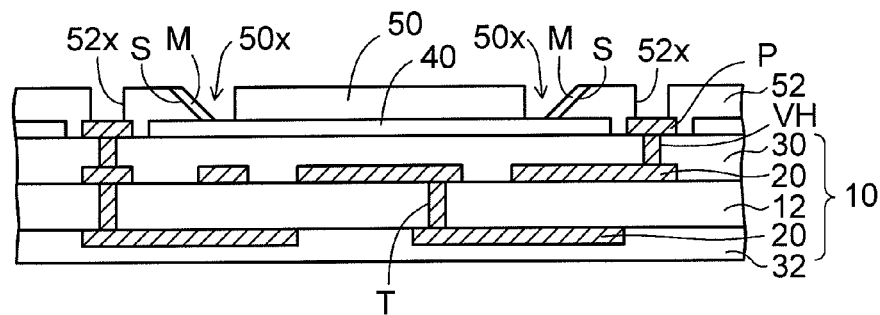
Figure 4C:
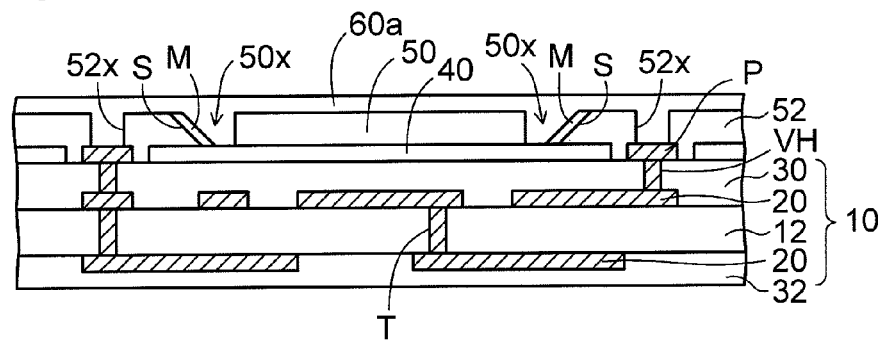
Figure 4D:
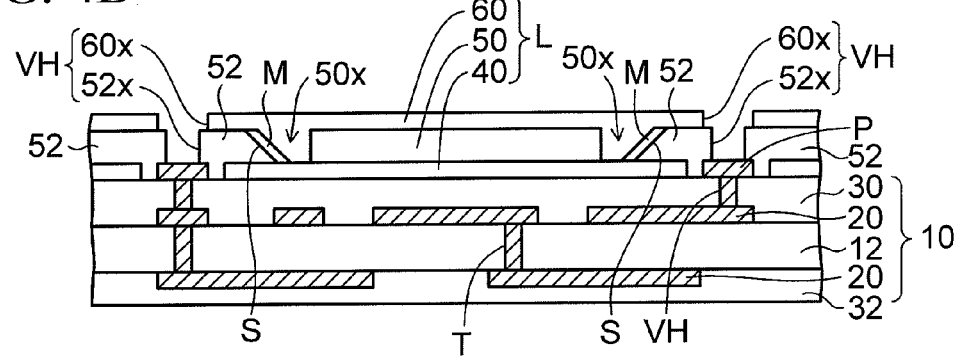
Figure 5:
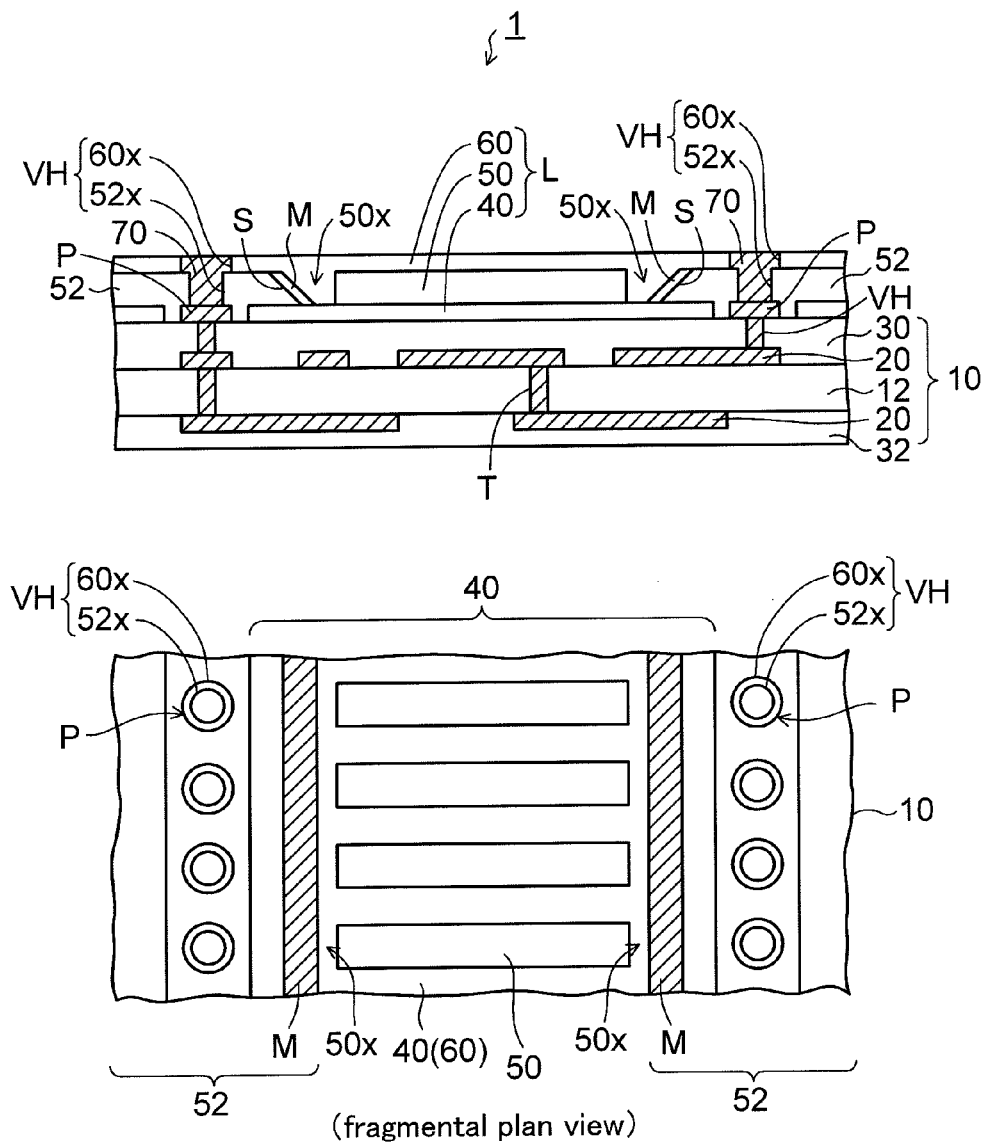
FIG. 5 is a sectional view and a plan view depicting an optoelectronic composite substrate according to the embodiment.

FIG. 2A to FIG. 4D are sectional views and plan views depicting a method of manufacturing an optoelectronic composite substrate according to an embodiment, and FIG. 5 is a sectional view and a plan view depicting an optoelectronic composite substrate according to the embodiment.

Figure 2A:
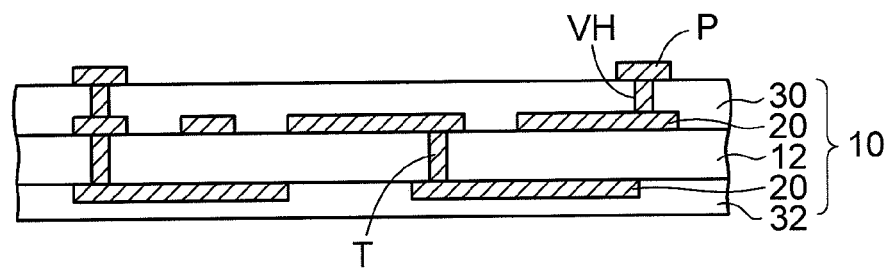
FIGS. 2A and 2B are sectional views and a plan view (#1) depicting a method of manufacturing an optoelectronic composite substrate according to an embodiment.

In the method of manufacturing the optoelectronic composite substrate according to the embodiment, first, a wiring substrate 10 as depicted in FIG. 2A is prepared. In the wiring substrate 10, a core substrate 12 is arranged in a center part of in the thickness direction. Penetration electrodes T are provided in the core substrate 12, and wiring layers 20 which are connected mutually via the penetration electrode T are formed on both surface sides of the core substrate 12 respectively.

An interlayer insulating layer 30 which covers the wiring layers 20 is formed on the upper surface side of the core substrate 12. Also, a solder resist 32 which covers the wiring layers 20 is formed on the lower surface side of the core substrate 12. Also, via holes VH which have a depth each reaching the wiring layer 20 are formed in the interlayer insulating layer 30.

Also, connection pads P each connected to the wiring layers 20 via the via hole VH (the buried via conductor) are formed on the interlayer insulating layer 30. The wiring layers 20 of the wiring substrate 10 and the connection pads P connected to these layers function as electric wirings.

Figure 2B:
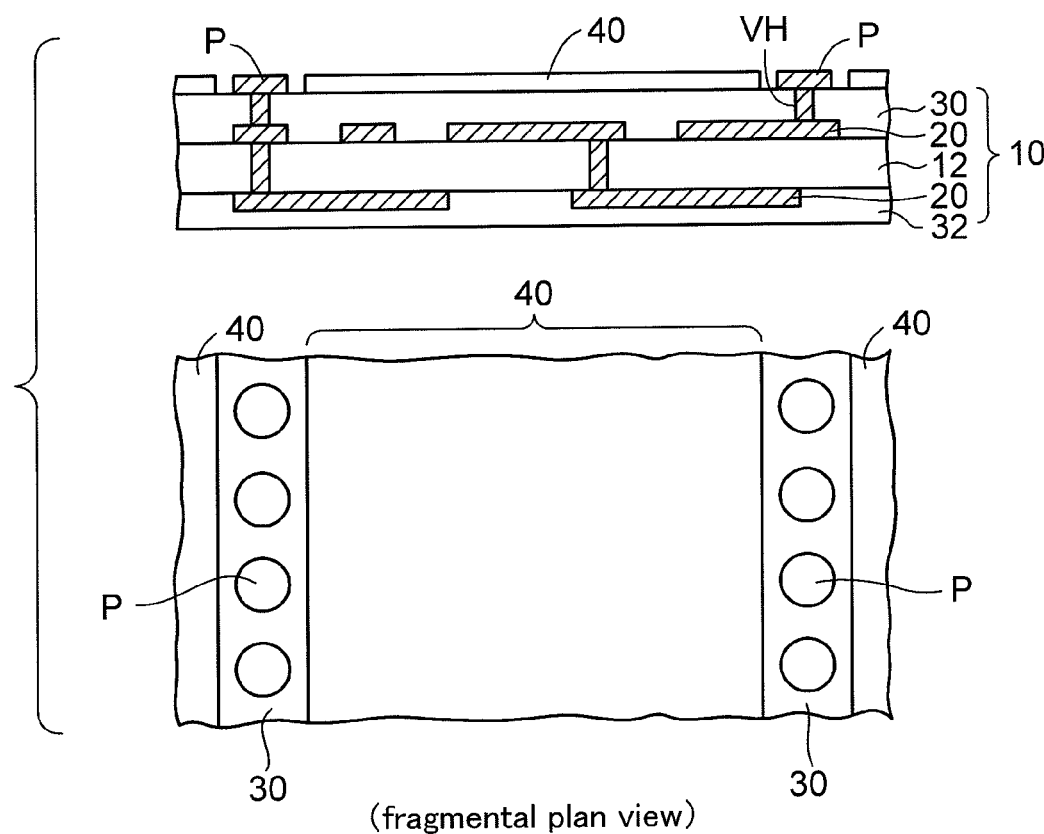

Then, as depicted in FIG. 2B, a photosensitive resin layer is formed on the upper surface side of the wiring substrate 10, then the exposure/development are performed based on the photolithography, and then the photosensitive resin layer is cured by applying the heat treatment at about 150° C. By this matter, first cladding layers 40 made to the pattern are formed. In the present embodiment, the first cladding layer 40 is formed in the region excluding the connection pads P so as not to occur the level difference on the connection pads P.

As the method of forming the photosensitive resin layer for obtaining the first cladding layers 40, a liquid photosensitive resin may be coated, or a semi-cured photosensitive resin sheet may be attached.

As depicted in a fragmental plan view of FIG. 2B, groups of a plurality of connection pads P which are arranged side by side in the vertical direction are arranged to oppose to each other bilaterally symmetrically. The first cladding layer 40 is arranged in the area located between a plurality of opposing connection pads P and the area located on the outside of the connection pads P respectively.

In this manner, the first cladding layer 40 is arranged as patterned layers in the areas except the connection pads P. Consequently, the first cladding layer 40 can function as the level-difference eliminating pattern which eliminates a level difference caused by the connection pad P.

Respective thicknesses of the connection pad P and the first cladding layer 40 can be set arbitrarily. In this case, it is preferable that, in order to eliminate satisfactorily a level difference caused by the connection pad P, a thickness of the first cladding layer 40 should be set equal to a thickness of the connection pad P. For example, respective thicknesses of the connection pad P and the first cladding layer 40 are set to 10 to 20 μm.

Here, in the example in FIG. 2B, the first cladding layer 40 is arranged in the outer area of the connection pad P. In this case, the first cladding layer 40 may not always be arranged in the outer area of the connection pad P.

Then, as depicted in FIG. 3A, a photosensitive resin layer 50a for obtaining the core layer is formed on the first cladding layers 40 and the connection pads P on the upper surface side of the wiring substrate 10. At this time, the first cladding layers 40 function as the level-difference eliminating pattern of the connection pads P, and as a result the photosensitive resin layer 50a is formed in a flat state over the whole upper surface.

As the method of forming the photosensitive resin layer 50a, a liquid photosensitive resin may be coated or a semi-cured photosensitive resin sheet may be attached.

Then, as depicted in FIG. 3B, a photomask 14 is arranged on the photosensitive resin layer 50a in a state that the photomask 14 contacts (closely attaches) to the photosensitive resin layer 50a. At this time, since no level difference is occurred on the upper surface of the photosensitive resin layer 50a, the whole of the photomask 14 can be brought into contact (closely attach) with the photosensitive resin layer 50a.

Then, in this state, the photosensitive resin layer 50a is exposed via the photomask 14. Then, as depicted in FIG. 3C, the photomask 14 is removed, then the photosensitive resin layer 50a is developed, and then the photosensitive resin layer 50a is cured by applying the heat treatment at about 150° C. Thus, a core layer 50 made to the pattern is obtained.

As depicted in a fragmental plan view of FIG. 3C, a belt-like core layer 50 which extends in the lateral direction is arranged in the areas on the first cladding layers 40 between respective opposing connection pads P respectively. A refractive index of the core layer 50 is set higher than respective refractive index of the first cladding layers 40 and a second cladding layer described later. A thickness of the core layer 50 is about 40 μm, and a pattern width of the core layer 50 is about 400 μm.

At this time, simultaneously, a peripheral resin portion 52 separated to have a predetermined interval from the core layer 50 is arranged on both end sides of the core layer 50 respectively. Then, a hole 52x is formed in the part of the peripheral resin portion 52 on the connection pad P. Then, intervals between both ends of the core layer 50 and the peripheral resin portion 52 function as a light path conversion region 50x respectively.

In this way, the photosensitive resin layer 50a is formed in a state that its whole upper surface is kept in a flat condition. Therefore, the contact exposure can be performed while contacting (closely attaching) the whole of the photomask 14 to the photosensitive resin layer 50a.

Accordingly, the primary performance of the contact exposure can be fully drawn out. As a result, variation in pattern widths of the core layers 50 which are obtained by patterning the photosensitive resin layer 50a can be suppressed, and also the core layers 50 which accommodates the design specification can be formed. Also, the primary resolution performance can be obtained. As a result, such a failure is not caused that the core layers 50 are formed in a mutually connected state, and thus the core layer 50 can be formed with good yield.

Further, as the photosensitive resin layer 50a for obtaining the core layer 50 and the peripheral resin portion 52, a photosensitive resin whose resolution is relatively high can be used. Therefore, not only the core layer 50 can be formed with high precision, but also the light path conversion region 50x where a light path conversion mirror is arranged, and the hole 52x through which the connection pad P are exposed can be arranged with high pattern precision.

Then, as depicted in FIG. 4A, in the peripheral resin portion 52 on both sides, the side surface on the core layer 50 side of the light path conversion region 50x is cut, by the rotary blade (cutting blade) of the cutting device so as to form an inclined surface respectively (bevel cut). Accordingly, a light path conversion inclined surface S which is inclined to intersect with the extending direction of the core layer 50 (the light propagation direction) at an angle of 45° is formed on both end sides of the core layer 50 respectively.

Here, instead of the use of the rotary blade, the light path conversion inclined surface S may be formed by processing the side surface of the peripheral resin portion 52 on the core layer 50 side by means of the laser ablation. Otherwise, the light path conversion region 50x is not formed upon patterning the photosensitive resin layer 50a by the photolithography, and the light path conversion region 50x having the light path conversion inclined surface S may be formed by the rotary blade or the laser ablation in the later step.

In this manner, the peripheral resin portion 52, which is formed by the identical layer with the core layer 50 and has the light path conversion inclined surface S on the side surfaces on the core layer 50 side, is formed on both end sides of the core layer 50 respectively.

Then, as depicted in FIG. 4B, a light-reflective metal layer is formed on the light path conversion inclined surface S selectively by the vapor deposition method or the sputter method, in a state that a mask (not shown) in which an opening portion is provided in the parts corresponding to the light path conversion inclined surfaces S respectively is arranged over the wiring substrate 10. Thus, a light path conversion mirror M is obtained on the light path conversion inclined surface S. As the light-reflective metal layer, gold (Au), aluminum (Al), or the like is preferably employed.

Then, as depicted in FIG. 4C, a photosensitive resin layer 60a is formed on the core layers 50 and the peripheral resin portions 52 so as to bury the holes 52x of the peripheral resin portion 52 and the light path conversion regions 50x. As the method of forming the photosensitive resin layer 60a, a liquid photosensitive resin may be coated or a semi-cured photosensitive resin sheet may be attached.

Then, as depicted in FIG. 4D, the photosensitive resin layer 60a is exposed/developed based on the photolithography, and then is cured by applying the heat treatment at about 150° C. Accordingly, a second cladding layer 60 covering the core layer 50 is formed.

The second cladding layer 60 is formed from an upper part of the core layer 50 to an upper part of the peripheral resin portions 52, and an opening portion 60x is provided on the hole 52x of the peripheral resin portion 52, and the opening portion 60x is communicated with the hole 52x. A thickness of the second cladding layer 60 is 10 to 20 μm.

In this fashion, an optical waveguide L having a structure in which the core layer 50 is surrounded by the first cladding layer 40 and the second cladding layer 60 is obtained. As the photosensitive resin for forming the core layer 50 and the first and second cladding layers 40, 60, a UV-cured type epoxy resin, or the like is preferably employed.

Then, the via hole VH reaching the connection pad P is constructed by the hole 52x in the peripheral resin portions 52 and the opening portion 60x in the second cladding layer 60.

Then, as depicted in FIG. 5, a connection electrode 70 which is connected electrically to the connection pad P is formed to be buried in the via holes VH. For example, the connection electrodes 70 can be formed by applying the refow-heating to the solder balls which are mounted on the via holes VH.

Accordingly, an optoelectronic composite substrate 1 of the present embodiment is obtained.

In the optoelectronic composite substrate 1 of the present embodiment, as depicted in FIG. 5, the first cladding layer 40 made to the pattern is formed in the area of the wiring substrate 10 explained in above FIG. 2A except the connection pads P. The first cladding layer 40 is arranged in the area between the opposing connection pads P and the outer areas of the connection pads P.

The core layers 50 which are patterned are formed on the first cladding layer 40 which is arranged in the area between the connection pads P. As depicted in a fragmental plan view of FIG. 5, the core layers 50 like a belt shape each extended in the lateral direction are arranged side by side in the vertical direction.

The peripheral resin portion 52 which is formed by the identical layer with the core layer 50 and is separated from the core layer 50 is arranged on both end sides of the core layer 50 respectively. Also, respective intervals between both ends of the core layer 50 and the peripheral resin portion 52 function as the light path conversion region 50x. In the peripheral resin portions 52 on both sides, the side surface of the core layer 50 side functions as the light path conversion inclined surface S which is inclined to intersect with the extending direction of the core layer 50 (the light propagation direction) at an angle of 45°. The light path conversion mirror M formed of a light-reflective metal layer is formed on the light path conversion inclined surface S.

Also, the holes 52x each reaching the connection pad P are provided in the peripheral resin portions 52. The second cladding layer 60 is formed on the core layers 50 and the peripheral resin portions 52. In a fragmental plan view of FIG. 5, the second cladding layer 60 is depicted in a perspective view.

The opening portions 60x each of which is communicated with the hole 52x in the peripheral resin portion 52 are formed in the second cladding layer 60. The via hole VH reaching the connection pad P is constructed by the hole 52x in the peripheral resin portion 52 and the opening portion 60x in the second cladding layer 60.

Also, the optical waveguide L is constructed by the core layer 50 and the first and second cladding layers 40, 60 which surround the core layer 50. A light path is converted by 90° by the light path conversion mirror M which is arranged on both ends of the core layer 50.

The connection electrode 70 which is electrically connected to the connection pad P and is formed of the solder, or the like is filled in the via holes VH respectively. The connection electrode 70 may be formed of the bump electrode which protrudes upward from the second cladding layer 60.

As described above, in the method of manufacturing the optoelectronic composite substrate of the present embodiment, the first cladding layer 40 is formed on the wiring substrate 10 including the connection pads P on the upper surface side, in the area except the connection pads P. The first cladding layer 40 functions as the level difference eliminating pattern which eliminates the level difference caused by the connection pad P.

Then, the photosensitive resin layer 50a for obtaining the core layer 50 is formed on the first cladding layer 40 and the connection pads P. At this time, the level difference caused by the connection pad P is eliminated by the first cladding layer 40, and thus the photosensitive resin layer 50a is formed such that its upper surface is kept in a flat state. Therefore, the core layers 50 and the peripheral resin portions 52 can be formed by patterning the photosensitive resin layer 50a based on the normal contact exposure with high precision.

By this matter, variation in the pattern widths of the core layers 50 can be suppressed, and also the core layers 50 which accommodates the design specification can be formed with high precision.

Also, in the step of forming the core layers 50, the peripheral resin portion 52 separated from the core layers 50 is formed simultaneously on both sides of the core layers 50, and also the light path conversion regions 50x for arranging the light path conversion mirror M and the holes 52x for exposing the connection pad P are arranged with high positional precision.

In this manner, in the optoelectronic composite substrate 1, such a structure is employed that the first cladding layer 40 is not formed on the connection pads P of the wiring substrate 10. Accordingly, the core layers 50 and the peripheral resin portions 52 can be formed by patterning the flat photosensitive resin layer 50a with high precision based on the contact exposure. As a result, the desired optical waveguide L which is optically coupled to the light path conversion mirror M with high precision can be constructed with good yield.

Figure 6:
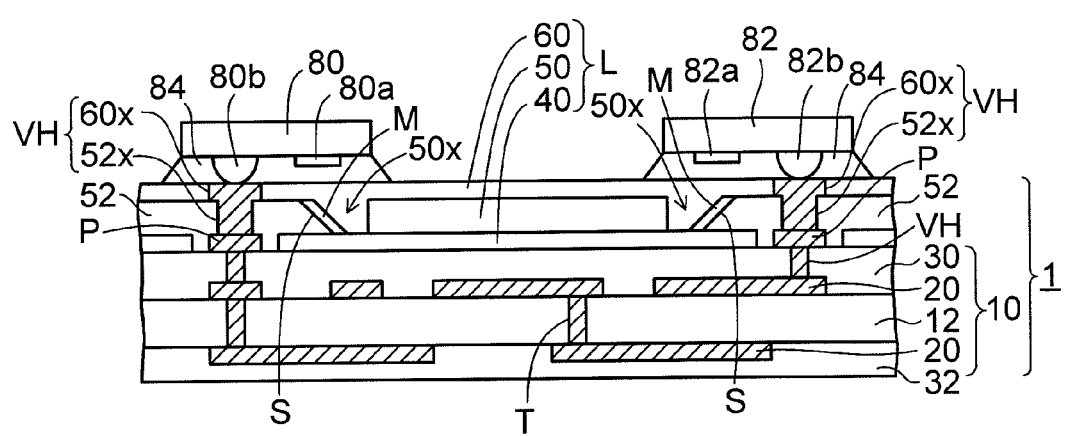
FIG. 6 is a sectional view depicting a state that a light emitting element and a light receiving element are mounted on the optoelectronic composite substrate in FIG. 5.

Next, a method of mounting a light emitting element and a light receiving element on the optoelectronic composite substrate 1 in FIG. 5 will be explained hereunder. As depicted in FIG. 6, a light emitting element 80 and a light receiving element 82 are prepared. As the light emitting element 80, a surface emitting laser (VCSEL: Vertical Cavity Surface Emitting Laser) is preferably employed. Also, as the light receiving element 82, a photodiode is preferably employed.

The light emitting element 80 has a light emitting portion 80a and connection terminals 80b on the lower surface side. Also, the connection terminals 80b of the light emitting element 80 are connected to the connection electrodes 70 on one end side of the optoelectronic composite substrate 1 and mounted thereon in a state that the light emitting portion 80a of the light emitting element 80 is directed downwardly.

At this time, the light emitting portion 80a of the light emitting element 80 is placed just above the light path conversion mirror M. Accordingly, the light emitting element 80 is optically coupled to one end side of the optical waveguide L (the core layer 50) by the light path conversion mirror M.

Also, the light receiving element 82 has a light receiving portion 82a and connection terminals 82b on its lower surface side. Then, the connection terminals 82b of the light receiving element 82 are connected the connection electrodes 70 on the other end side of the optoelectronic composite substrate 1 and mounted thereon in a state that the light receiving portion 82a of the light receiving element 82 is directed downwardly.

At this time, the light receiving portion 82a of the light receiving element 82 is placed just above the light path conversion mirror M. Accordingly, the light receiving element 82 is optically coupled to the other end side of the optical waveguide L (the core layer 50) by the light path conversion mirror M.

Then, an underfill resin 84 is filled in a clearance located under the light emitting element 80. Also, the underfill resin 84 is filled in a clearance located under the light receiving element 82. As the underfill resin 84, the identical resin with the above core layer 50 or the first and second cladding layers 40, 60 is preferably employed.

In the optoelectronic composite substrate 1 of the present embodiment, an electric signal which is output from a first LSI chip (CPU, or the like) (not shown) mounted on the optoelectronic composite substrate 1 is supplied to the light emitting element 80, and a light is emitted downwardly from the light emitting portion 80a of the light emitting element 80.

The light which is emitted from the light emitting element 80 transmits the underfill resin 84 below the light emitting element 80, and reaches the light path conversion mirror M provided on one end side of the optical waveguide L. Then, the light is reflected by the light path conversion mirror M, so that the light path is converted by 90° and thus the light enters the core layer 50.

Then, the light which enters the core layer 50 propagates through the core layer 50 while repeating a total reflection in the core layer 50, and reaches the light path conversion mirror M on the other end. Then, the light is reflected by the light path conversion mirror M on the other end, then the light path is converted by 90°, and then the light transmits the underfill resin 84, and the light enters the light receiving portion 82a of the light receiving element 82.

The light receiving element 82 converts the light signal into an electric signal, and then the electric signal is supplied to a second LSI chip (a memory, or the like)(not shown) mounted on the optoelectronic composite substrate 1.

In this manner, in the optoelectronic composite substrate 1 of the present embodiment, the optical waveguide L having desired characteristic is provided, and therefore the optoelectronic composite substrate 1 can be used as the mounting substrate for the light emitting element 80 and the light receiving element 82 which have high-performance.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

What is claimed is:

1. An optoelectronic composite substrate, comprising:
   a wiring substrate including an opposing connection pads on an upper surface;
   an optical waveguide including a first cladding layer formed in an area between the connection pads on the wiring substrate, a core layer formed on the first cladding layer, and a second cladding layer covering the core layer, wherein the first cladding layer is arranged on a region except the connection pads, and is separated from the connection pads;
   a peripheral resin portion arranged on both end sides of the core layer respectively in a state that the peripheral resin portion is separated from the core layer, and having an inclined surface on the core layer side, and formed by an identical layer with the core layer;
   a light path conversion mirror formed on the inclined surface of the peripheral resin portion;
   a via hole provided in the peripheral resin portion and the second cladding layer on the connection pads; and
   a connection electrode formed in the via hole and connected to the connection pad.

2. An optoelectronic composite substrate according to claim 1, wherein a thickness of the first cladding layer is set identically to a thickness of the connection pad.

3. An optoelectronic composite substrate according to claim 1, wherein the first cladding layer, the core layer, and the second cladding layer are obtained by patterning a photosensitive resin layer.

4. An optoelectronic composite substrate according to claim 1, further comprising:
   a light emitting element coupled optically to one end side of the optical waveguide by the light path conversion mirror, and connected to the connection electrode on the one end side of the optical waveguide; and
   a light receiving element coupled optically to other end side of the optical waveguide by the light path conversion mirror, and connected to the connection electrode on the other end side of the optical waveguide.

5. A method of manufacturing an optoelectronic composite substrate, comprising:
   preparing a wiring substrate including an opposing connection pads on an upper surface;
   forming a first cladding layer in an area between the connection pads on the wiring substrate, wherein the first cladding layer is arranged on a region except the connect pads, and is separated from the connection pads;
   forming a core layer on the first cladding layer;
   forming a peripheral resin portion which is arranged on both end sides of the core layer respectively in a state that the peripheral resin portion is separated from the core layer, and which has an inclined surface on the core layer side, and in which a hole is provided on the connection pad, and which is formed by an identical layer with the core layer;
   forming a light path conversion mirror on the inclined surface of the peripheral resin portion;
   forming a second cladding layer covering the core layer, and obtaining an optical waveguide having a structure in which the core layer is surrounded by the first and second cladding layer, and forming an opening portion which is communicated with the hole of the peripheral resin portion, in the second cladding layer, thus obtaining a via hole reaching the connection pad; and
   forming a connection electrode connected to the connection pad in the via hole.

6. A method of manufacturing an optoelectronic composite substrate, according to claim 5, wherein, in the forming of the first cladding layer, a thickness of the first cladding layer is set identically to a thickness of the connection pad.

7. A method of manufacturing an optoelectronic composite substrate, according to claim 5, wherein the first cladding layer, the core layer, and the second cladding layer are formed by patterning a photosensitive resin layer based on a photolithography.

8. A method of manufacturing an optoelectronic composite substrate, according to claim 5, further comprising:
   mounting a light emitting element so as to couple optically to one end side of the optical waveguide by the light path conversion mirror and connected to the connection electrode on the one end side of the optical waveguide, and a light receiving element so as to couple optically to other end side of the optical waveguide by the light path conversion mirror and connected to the connection electrode on the other end side of the optical waveguide.

* * * * *